United States Patent [19]
Koide et al.

[11] Patent Number: 5,936,292
[45] Date of Patent: Aug. 10, 1999

[54] STRUCTURE OF THIN FILM TRANSISTOR AND GATE TERMINAL HAVING A CAPACITIVE STRUCTURE COMPOSED OF THE TFT ELEMENTS

[75] Inventors: Shin Koide; Susumu Ohi; Shigeru Kimura, all of Tokyo, Japan

[73] Assignee: NEC Corporation, Tokyo, Japan

[21] Appl. No.: 08/877,550

[22] Filed: Jun. 17, 1997

[51] Int. Cl.⁶ ................................................. H01L 29/78
[52] U.S. Cl. .......................... 257/412; 257/59; 257/72; 257/296; 257/298; 257/300; 257/347; 257/458; 349/44; 349/46; 349/54; 349/110; 349/111; 349/147
[58] Field of Search ................................ 349/46, 44, 54, 349/110, 111, 147; 257/57, 59, 72, 296, 298, 300, 303, 306, 311, 347, 412, 458

[56] References Cited

U.S. PATENT DOCUMENTS 4,760,034  7/1988  Barden ..................................... 438/251
5,162,933  11/1992  Kakuda et al. ......................... 349/147

FOREIGN PATENT DOCUMENTS 358003270  1/1983  Japan ..................................... 257/303
7-152047  6/1995  Japan .
7-162007  6/1995  Japan .

Primary Examiner—Tom Thomas
Assistant Examiner—Fetsum Abraham
Attorney, Agent, or Firm—Whitham, Curtis & Whitham

[57]  ABSTRACT

A thin film transistor of an active matrix liquid crystal display unit has a gate electrode continued to a gate terminal supplied with a gate control signal, a gate insulating layer formed beneath the gate electrode and the gate terminal, source and drain electrodes formed between the gate insulating layer and an insulating layer and an amorphous silicon layer extending on the insulating layer between the source and drain electrodes, and a silicide layer is inserted between the insulating layer and the gate insulating layer so as to enhance the adhesion therebetween.

15 Claims, 11 Drawing Sheets

# STRUCTURE OF THIN FILM TRANSISTOR AND GATE TERMINAL HAVING A CAPACITIVE STRUCTURE COMPOSED OF THE TFT ELEMENTS

FIELD OF THE INVENTION

This invention relates to a structure of a thin film transistor and a gate line and, more particularly, to a structure of a thin film transistor and a gate terminal reliable and fabricated through a simple process sequence.

DESCRIPTION OF THE RELATED ART

An active matrix liquid crystal display unit has pixel electrodes arranged in matrix on a bottom substrate, and thin film switching transistors are further formed on the bottom substrate so as to selectively connect image signal lines to the pixel electrodes. The bottom substrate is spaced from a top substrate with a counter electrode, and liquid crystal fills the gap between the bottom substrate and the top substrate. The thin film switching transistors are selectively gated by control signal lines, and allow the image signal lines to apply image carrying signals to associated pixel electrodes. Then, the liquid crystal molecules over the pixel electrodes rise, and change the transmittance of the pixels so as to form a visual image.

FIG. 1 illustrates the equivalent circuit on a transparent glass substrate. A plurality of pixel electrodes PE11, PE12, PE13, PE21, PE22, PE23, PE31, PE32 and PE33 are arranged in rows and columns over the transparent glass substrate, and thin film switching transistors TFT11, TFT12, TFT13, TFT21, TFT22, TFT23, TFT31, TFT32 and TFT33 are connected to the pixel electrodes PE11 to PE33, respectively. A counter electrode CE is opposed to the pixel electrodes PE11 to PE33, and liquid crystal LC fills the gap between the pixel electrodes PE11 to PE33 and the counter electrode CE. The pixel electrodes PE11 to PE33, the counter electrode CE and the liquid crystal form a plurality of liquid crystal capacitors CP11–CP13, CP21–CP23 and CP31–CP33.

The columns of liquid crystal capacitors CP11–CP31, CP12–CP32 and CP13–CP33 are associated with a plurality of image signal lines D1, D2, D3 and D4 extending over the transparent glass substrate, and the image signal lines D1–D4 are connected to the thin film switching transistors TFT11–TFT33 of the columns, respectively. The image signal lines D1 to D4 are terminated at drain terminals TD1 to TD4, and a semiconductor chip (not shown) is connected to the drain terminals TD1 to TD4. The semiconductor chip supplies image carrying signals through the drain terminals TD1 to TD4 to the image signal lines D1 to D4.

On the other hand, the rows of liquid crystal capacitors CP11–CP13, CP21–CP23 and CP31–CP33 are associated with a plurality of gate control lines CL1, CL2, CL3 and CL4, and the thin film switching transistors TFT11–TFT33 of the rows are gated by the gate control lines CL1–CL4. The image signal lines D1 to D4 are electrically isolated from the gate control lines CL1 to CL4. The gate control lines CL1 to CL4 are also terminated at gate terminals TG1 to TG4 (see FIG. 2), respectively, and another semiconductor chip is connected to the gate terminals TG1 to TG4. The semiconductor chip sequentially supplies scanning signals through the gate terminals TG1 to TG4 to the gate control lines CL1 to CL4, and causes the thin film switching transistors TFT11 to TFT33 to selectively connect the image signal lines D1 to D4 to the pixel electrodes PE11 to PE33. The drain terminals TD1 to TD4 and the gate terminals TG1 to TG4 are patterned on the transparent glass substrate SB1.

When the semiconductor chips are connected to the drain terminals TD1 to TD4 and the gate terminals TG1 to TG4, anisotropic conductive films are laminated on the drain terminals TD1 to TD4 and the gate terminals TG1 to TG4, and the conductive leads of the semiconductor chips are pressed against the anisotropic conductive films so as to connect the semiconductor chips to the drain terminals TD1 to TD4 and the gate terminals TG1 to TG4.

Various kinds of thin film transistors have been proposed such as a non-inverted stagger thin film transistor, an inverted stagger thin film transistor and a coplanar thin film transistor. A typical example of the non-inverted stagger thin film transistor is disclosed in Japanese Patent Publication of Unexamined Application Nos. 7-152047 and 7-162007.

FIG. 3 illustrates the non-inverted stagger thin film transistor disclosed in the Japanese Patent Publication of Unexamined Applications. The prior art thin film transistor is fabricated on a transparent glass substrate 1, and a photo-shield layer 2a is patterned on the transparent glass substrate 1. The photo-shield layer 2a is covered with an insulating layer 2b of silicon oxide or silicon nitride. A source electrode 3a of indium tin oxide and a drain electrode 3b of indium tin oxide are patterned on the insulating layer 2b, and are spaced from each other. An amorphous silicon layer 3c is formed on the insulating layer 2b, and are held in contact with the source and drain electrodes 3a/3b at both end thereof. The amorphous silicon layer 3c is overlain by a gate insulating layer 3d of silicon oxide or silicon nitride which in turn is overlain by a gate electrode 3e. One of the image signal lines DL is connected to the drain electrode 3b.

An inverted stagger thin film transistor achieves a conductance larger than that of the non-inverted stagger thin film transistor. However, the fabrication process for the non-inverted stagger thin film transistor is much simpler than that of the inverted stagger thin film transistor. In fact, the amorphous silicon layer 3c, the gate insulating layer 3d are successively patterned in a self-aligned manner with the gate electrode 3e, and the complicated lithography is required for the gate electrode 3e only. For this reason, the non-inverted stagger thin film transistor is mainly employed in the active matrix liquid crystal display unit.

Although the structure of the gate terminal TG1/TG2/TG3/TG4 is not disclosed in documents, a standard gate terminal TG has a single layer structure, and is patterned on an insulating layer 4a of silicon oxide or silicon nitride formed on a transparent glass substrate 4b as shown in FIG. 4. The gate terminals TG1 to TG4 are connected through the gate control lines CL1 to CL4 to the gate electrodes 3e of the thin film switching transistors TFT11 to TFT33, and the gate terminals TG1 to TG4 and the gate electrodes 3e are assumed to be patterned from a single conductive layer.

Comparing the structure shown in FIG. 3 with the structure shown in FIG. 4, the transparent glass substrate 1 and the insulating layer 2b are corresponding to the transparent glass substrate 4b and the insulating layer 4a. However, the amorphous silicon layer 3c and the gate insulating layer 3d are deleted from between the insulating layer 4a and the gate terminal TG.

The thin film switching transistors TFT11 to TFT33 and the gate terminals TG1 to TG4 are fabricated on the transparent glass substrate SB1 as follows.

FIGS. 5A to 5G illustrate the prior art process sequence. The prior art process starts with preparation of a transparent glass substrate 5a. Photo-shielding material is deposited over the entire surface of the transparent glass substrate 5a, and the photo-shielding material layer is patterned into a photo-shield layer 5b. The photo-shield layer 5b prevents an amorphous silicon layer from light, and decreases of-current. In a standard liquid crystal display unit, the photo-shield layer 5b is provided on the transparent glass substrate 5b. However, when the thin film transistor is fabricated on a substrate of another application without an amorphous silicon layer, the photo-shield layer would not be formed on the transparent glass substrate 5a.

Silicon oxide or silicon nitride is deposited over the entire surface of the resultant structure, and the photo-shield layer 5b and exposed area of the transparent glass substrate 5a are covered with an insulating layer 5c as shown in FIG. 5A.

Subsequently, indium tin oxide is deposited over the entire surface of the insulating layer 5c, and forms an indium tin oxide layer 6a as shown in FIG. 5B.

A photo-resist etching mask (not shown) is patterned on the indium tin oxide layer 6a by using a photo-lithography, and the indium tin oxide layer 6a is selectively etched away. Then, the indium tin oxide layer 6a is patterned into source and drain electrodes 6b and 6c as shown in FIG. 5C. The photo-resist etching mask is stripped off.

Conductive metal is deposited over the entire surface of the resultant structure, and the source and drain electrodes 6b/6c are covered with a conductive metal layer 6d as shown in FIG. 5D. A photo-resist etching mask (not shown) is patterned on the conductive metal layer 6d, and the conductive metal layer 6d is patterned into an image signal line 6e as shown in FIG. 5E. The photo-resist etching mask is stripped off.

Subsequently, amorphous silicon is deposited over the entire surface of the resultant structure, and the source and drain electrodes 6b/6c and the image signal line 6e are covered with an amorphous silicon layer 6f. Silicon oxide or silicon nitride is deposited over the entire surface of the amorphous silicon layer 6f, and the amorphous silicon layer 6f is covered with an insulating layer 6g. Conductive metal is deposited over the entire surface of the insulating layer 6g, and the insulating layer 6g is overlain by a conductive metal layer 6h as shown in FIG. 5F.

A photo-resist etching mask (not shown) is patterned on the conductive metal layer 6h by using the photo-lithography, and the conductive metal layer 6h, the insulating layer 6g and the amorphous silicon layer 6f are successively etched away so as to form an amorphous silicon layer 6i, a gate insulating layer 6j and a gate electrode 6k as shown in FIG. 5G. Thus, only one photo-resist etching mask is required for the amorphous silicon layer 6i, the gate insulating layer 6j and the gate electrode 6k, and the process sequence is made simple.

When a gate terminal TG is concurrently patterned from the conductive metal layer 6h, an amorphous silicon layer 6i' and an insulating layer 6j' are left between the insulating layer 5c and a conductive layer 6k' serving as the gate terminal TG. The amorphous silicon layer 6i' and the insulating layer 6j' are merged with the amorphous silicon layer 6i and the gate insulating layer 6j, respectively, because the conductive layer 6k' prevents the insulating layer 6g and the amorphous silicon layer 6f from etchant. Thus, the insulating layer 6j' and the amorphous silicon layer 6i' are never avoidable in so far as the gate electrode 6k, the gate insulating layer 6j and the amorphous silicon layer 6i are successively patterned by using the photo-resist mask.

A problem is encountered in the prior art gate terminals in that the gate terminal TG tends to be peeled along the boundary between the insulating layer 5c and the amorphous silicon layer 6i'. The reason why the gate terminal TG is peeled is large difference in stress. The conductive layer 6k' is usually formed of chromium, and the stress between the chromium and a crystal silicon is of the order of $5 \times 10^9$ N/m$^2$. On the other hand, the stress between the silicon nitride and the crystal silicon is of the order of $7 \times 10^8$ N/m$^2$. Thus, the chromium is causative of the stress almost ten times larger than that of the silicon nitride. When a layer causative of large stress is laminated over the layer causative of small stress, the layers tend to be peeled.

Although the stress is also exerted on the gate electrode 6k, the gate structure is less liable to be peeled, because the gate structure has the width less than a third of the width of the gate terminal TG.

If the insulating layer 6j' and the amorphous silicon layer 6i' are etched away before the deposition of the conductive metal layer 6h. The gate terminal TG is less liable to be peeled. However, a photo-resist etching mask is required for the removal, and the photo-lithography makes the process complicated.

Thus, there is a trade-off between the reliability of gate terminals and the simple process sequence.

SUMMARY OF THE INVENTION

It is therefore an important object of the present invention to provide a structure of a thin film transistor and a gate terminal which is reliable without sacrifice of a simple process sequence.

To accomplish the object, the present invention proposes to increase the adhesion between an amorphous silicon layer and an insulating layer through a silicidation.

In accordance with the present invention, there is provided a structure fabricated on a substrate structure, comprising: a thin film transistor including source and drain electrodes formed on the substrate structure and spaced apart form each other, a semiconductor layer extending on the substrate structure between the source and drain electrodes and held in contact with the source and drain electrodes, a gate insulating layer formed on the semiconductor layer, and a gate electrode formed on the gate insulating layer; a multi-layered structure including a silicide layer contiguous to the semiconductor layer and formed on the substrate structure, and a first insulating layer continued from the gate insulating layer and covering at least the silicide layer; and a gate terminal continued from the gate electrode and formed on the first insulating layer.

BRIEF DESCRIPTION OF THE DRAWINGS

The features and advantages of the terminal according to the present invention will be more clearly understood from the following description taken in conjunction with the accompanying drawings in which.

DESCRIPTION OF THE PREFERRED EMBODIMENTS

First Embodiment

Figure 7:
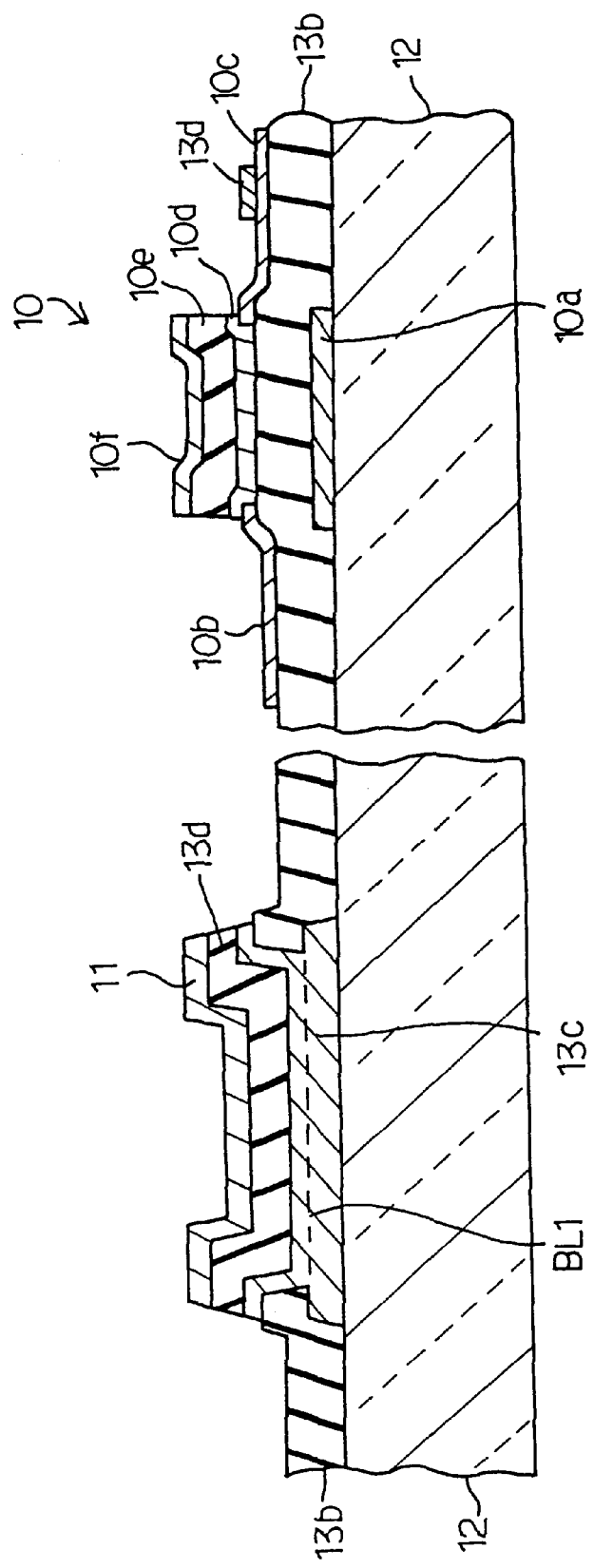
FIG. 7 is a cross sectional view showing the structure of a thin film transistor and a gate terminal incorporated in a liquid crystal display unit according to the present invention.

FIG. 7 illustrates a part of a liquid crystal display unit embodying the present invention. Although only a thin film transistor 10, a gate terminal 11 and only one image signal line 13a are formed on a transparent glass substrate 12, other thin film transistors, pixel electrodes, other image signal lines, gate control lines are also formed on the transparent glass substrate 12, and liquid crystal fills the gap between the transparent glass substrate 12 and another transparent glass substrate (not shown) where a counter electrode (not shown) is formed as similar to the prior art liquid crystal display unit.

Figure 1:
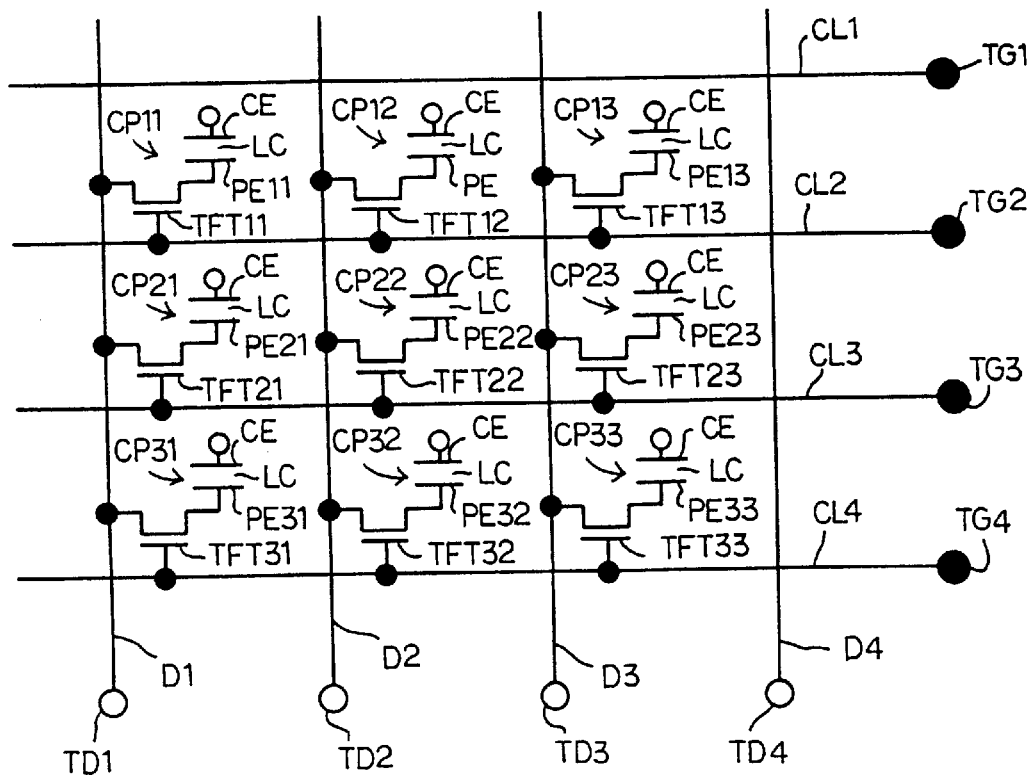
FIG. 1 is a circuit diagram showing the equivalent circuit of the prior art active matrix liquid crystal display unit.
Figure 2:
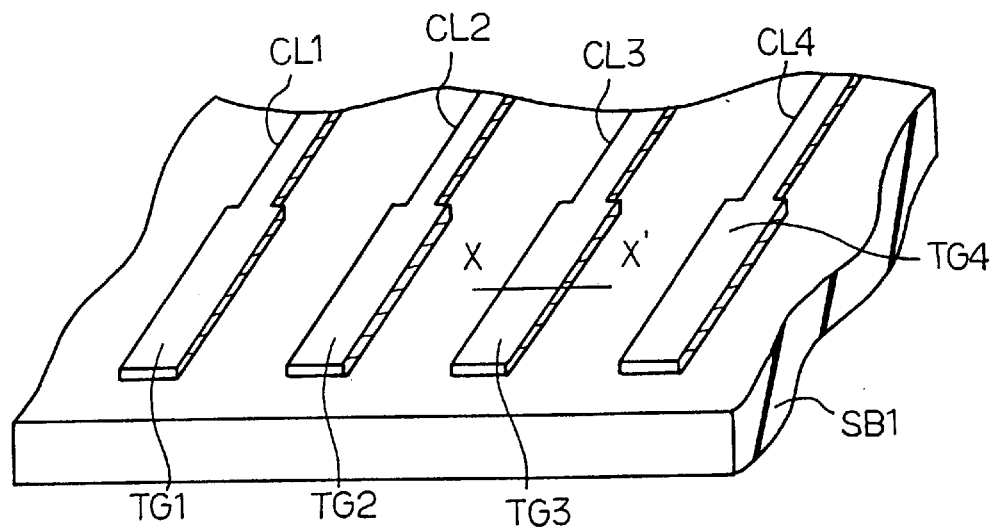
FIG. 2 is a perspective view showing the gate terminals of the gate control lines incorporated in the prior art active matrix liquid crystal display unit.
Figure 3:
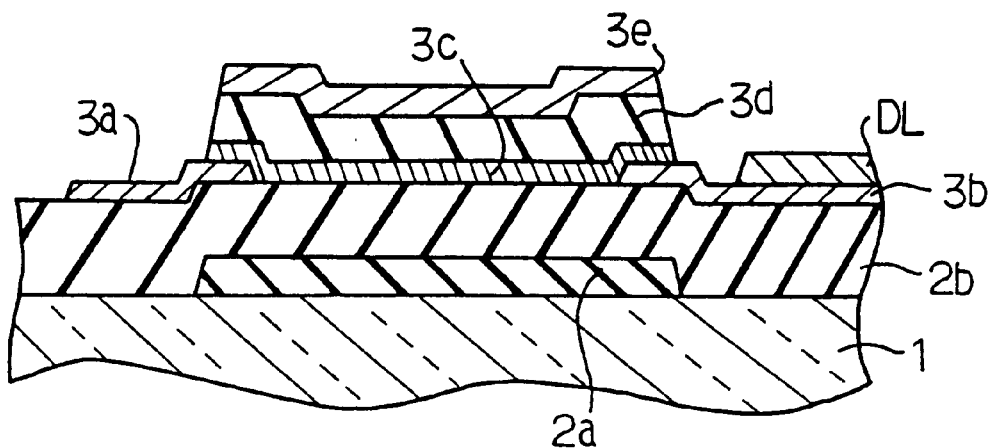
FIG. 3 is a cross sectional view showing the structure of the thin film transistor disclosed in the Japanese Patent Publication of Unexamined Applications.
Figure 4:
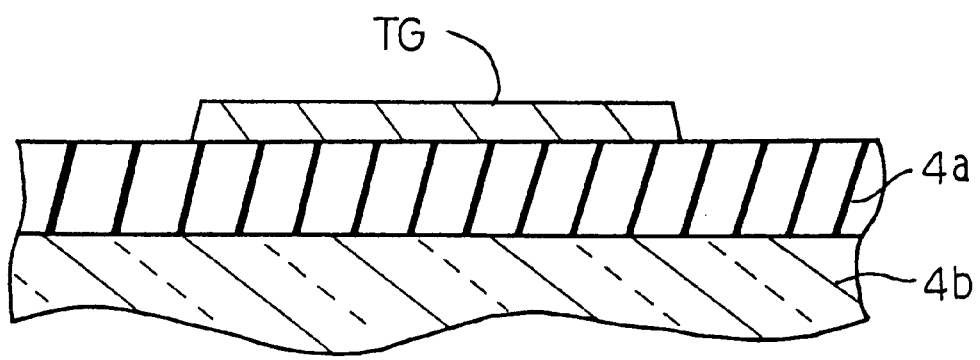
FIG. 4 is a cross sectional view taken along line X–X' of FIG. 2 and showing the structure of the gate terminal.

The thin film transistor 10 includes a photo-shield plate 10a covered with an insulating layer 13b of silicon oxide or silicon nitride, a source electrode 10b formed on the insulating layer 13b, a drain electrode 19c also formed on the insulating layer 13b and spaced from the source electrode 10b, an amorphous silicon layer 10d bridging the gap between the source and drain electrodes 10b and 10c, a gate insulating layer 10e laminated on the amorphous silicon layer 10d and a gate electrode 10f formed on the gate insulating layer 10e. Thus, the thin film transistor 10 is similar in structure to the prior art thin film transistor shown in FIG. 3.

The gate terminal 11 and the gate electrode 10f form parts of one of the gate control lines (not shown), and, accordingly, are electrically connected to each other.

A silicide layer 13c is formed on the transparent glass substrate 12, and is covered with the insulating layer 13b. The silicide layer 13c is strongly adhered to the transparent glass substrate 12, and does not allow the insulating layer 13b to be peeled from the transparent glass substrate 12.

As will be described hereinlater, the silicide layer 13c was formed through the reaction between a silicidable layer and an amorphous silicon layer concurrently deposited together with the amorphous silicon layer 10d. Broken line BL1 is indicative of the boundary between the silicidable layer and the amorphous silicon layer. The silicidable layer was formed of any kind of metal and alloy which reacts with silicon at low temperature for producing silicide. The metal and the alloy available for the silicidable layer are listed in the handbook entitled as "Ultra LSI Process Data Handbook" published by Science Forum on Apr. 15, 1982, and Ti, Cr, Ni, Mo, Ta and W are examples of the metal reacting with the silicon. The alloy may contain at least one of Ti, Cr, Ni, Mo, Ta and W. Compound which contains the metal and/or the alloy is also available for the metal layer. The metal, the alloy or the compound reacted with the amorphous silicon during the deposition of the amorphous silicon or a post annealing.

Figure 8:
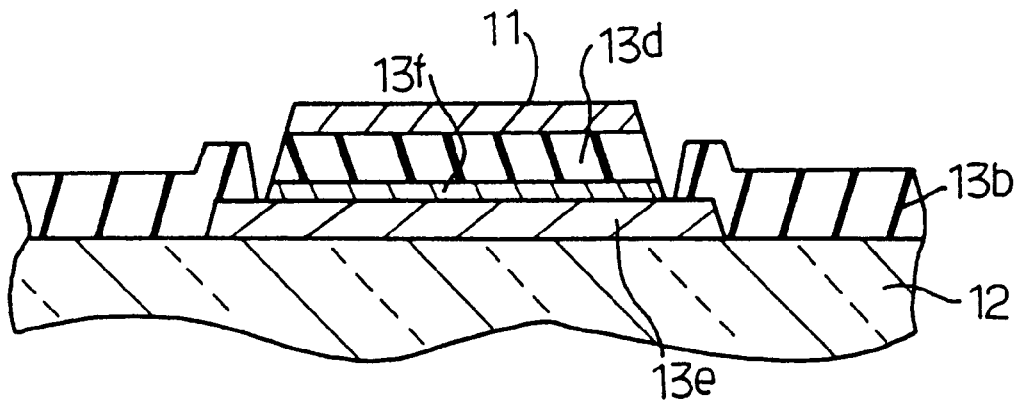
FIG. 8 is a cross sectional view showing the structure of a modification of the structure shown in FIG. 7.

The insulating layer 13b may be removed from the periphery of the gate terminal 11 as shown in FIG. 8. Although the metal layer 13e is separated from the amorphous silicon layer 13f in FIG. 8, the metal reacts with the amorphous silicon during the deposition of the amorphous silicon or a post annealing, and the metal layer 13e is merged with the amorphous silicon layer 13f so as to form a metal silicide layer.

The silicide layer 13c is overlain by an insulating layer 13d merged with the gate insulating layer 10e, and the gate terminal 11 is formed on the insulating layer 13d.

The present inventors evaluated the silicide layer as follows. The present inventors formed samples of the gate terminal structure shown in FIG. 7, and measured the adhesion between the silicide layers and the transparent glass substrate of the samples. The adhesion was equal to or greater than $100 \times 10^6$ Pa, and a crack or peeling was never observed in the samples.

The present inventor further formed comparative samples of the structure where non-silicidable layer of aluminum and indium tin oxide were formed between the transparent glass substrates and the amorphous silicon layers. When the non-silicidable layer was aluminum, the adhesion was less than $10 \times 10^6$ Pa. When the comparative samples included the indium tin oxide layers, the adhesion was also less than $10 \times 10^6$ Pa. Thus, the silicide layer surely improved the adhesion, and prevented the gate terminal from the peeling.

Third Embodiment

Figure 9:
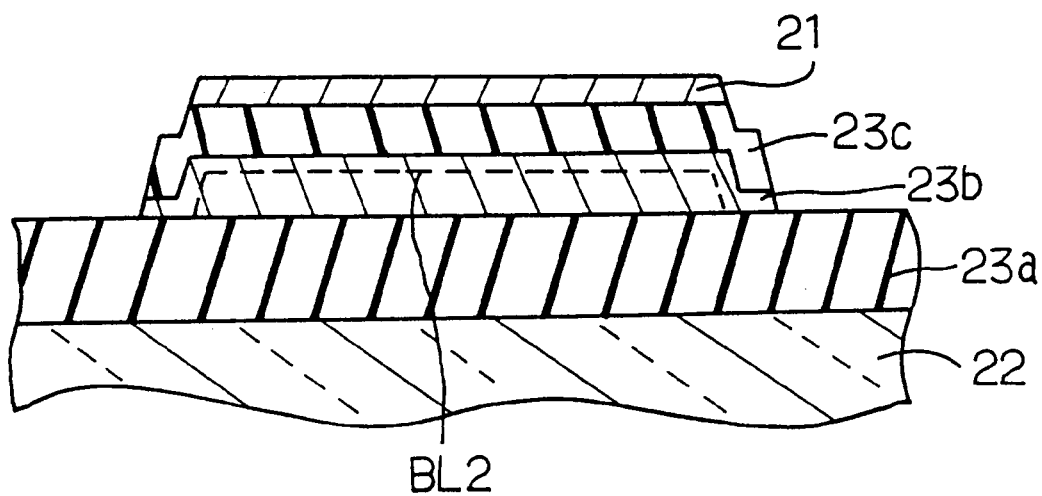
FIG. 9 is a cross sectional view showing the structure of a gate terminal incorporated in another liquid crystal display unit according to the present invention.

Turning to FIG. 9 of the drawings, another gate terminal 21 is formed over a transparent glass substrate 22. The transparent glass substrate 22 is overlain by an insulating layer 23a of silicon oxide or silicon nitride, and a metal silicide layer 23b is formed on the insulating layer 23a. The metal silicide layer 23b was produced through the chemical reaction between a silicidable layer and an amorphous layer. The silicidable layer was formed of metal such as, for example, Ti Cr, Ni, Mo, Ta or W, alloy or silicidable compound. Broken line BL2 is indicative of the boundary between the silicidable layer and the amorphous silicon layer. Compound which contains the metal and/or the alloy is also available for the silicidable layer.

The silicide layer 23b is overlapped with an insulating layer 23c, and the insulating layer 23c is formed from a silicon oxide layer, a silicon nitride layer or a composite layers of the silicon oxide layer and the silicon nitride layer. The silicide layer 23b enhances the adhesion between the insulating layers 23a and 23c. On the insulating layer 23c is formed the gate terminal 21 which is formed of chromium, aluminum or aluminum alloy.

Figure 10:
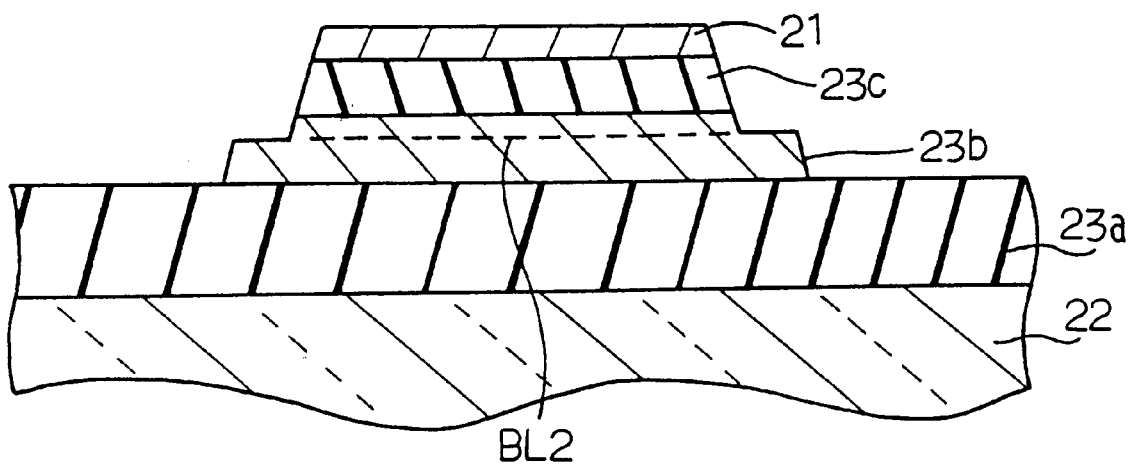
FIG. 10 is a cross sectional view showing the structure of a modification of the structure shown in FIG. 9.

The insulating layer 23c may be removed from the periphery of the silicide layer 23b as shown in FIG. 10.

The present inventors evaluated the silicide layer as follows. The present inventors formed samples of the gate terminal, and the samples were 0.12 millimeter by 5 millimeters. The dimensions defined the maximum area to be presently required for the gate terminal. The silicidable layers were formed of Cr, Mo and W, and the insulating layers were formed of silicon oxide and the silicon nitride.

The gate terminal 21 is continued from the gate electrode of a thin film transistor. The thin film transistor is similar in structure to the thin film transistor 10, and the photo-shield layer 10a may be formed between the transparent glass substrate 22 and the insulating layer 23a.

The present inventors measured the adhesion between the silicidable layers and the silicon oxide/silicon nitride layers of the samples, and confirmed that the adhesion was $100 \times 10^6$ Pa to $170 \times 10^6$ or more. The present inventors further measured the adhesion between the silicidable layers and the amorphous silicon layers, and confirmed that the adhesion ranged between $80 \times 10^6$ Pa and $160 \times 10^6$ Pa. The present inventors observed the samples to see whether or not a peeling took place. No sample had a crack or peeling.

Subsequently, description is made on a process of fabricating the structure shown in FIG. 10 with reference to FIGS. 11A to 11G. Although the thin film transistor is concurrently fabricated together with the gate terminal 21, the thin film transistor is not shown in FIGS. 11A to 11g, because FIGS. 5A to 5G shows the thin film transistor during the fabrication process.

Figure 5A:
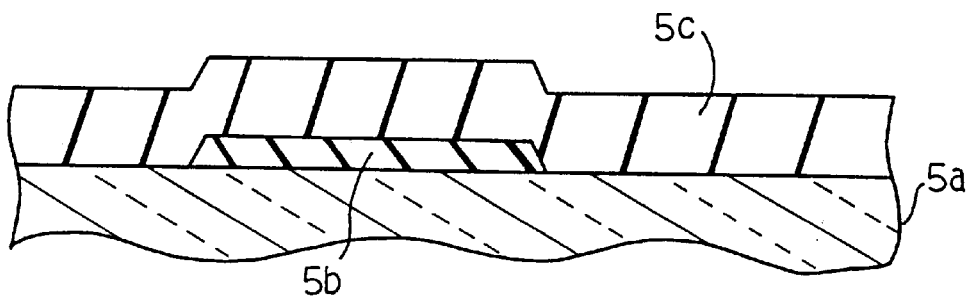
FIGS. 5A to 5G are cross sectional views showing the prior art process for fabricating the thin film transistor and the gate terminal.
Figure 11A:
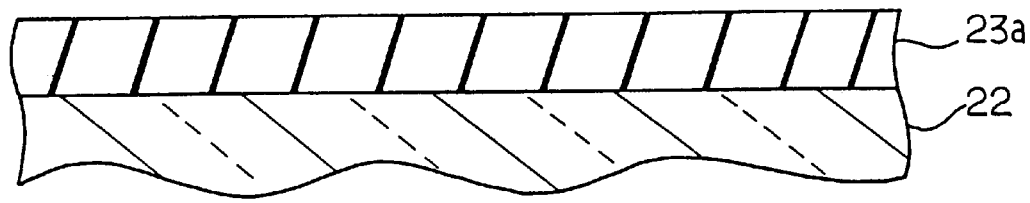
FIGS. 11A to 11G are cross sectional views showing a process sequence for fabricating the structure shown in FIG. 9.

The process starts with preparation of the transparent glass substrate 22. Silicon oxide is deposited over the entire surface of the glass substrate 22 by using a sputtering or a chemical vapor deposition, and forms the insulating layer 23a as shown in FIG. 11A. The resultant structure of the thin film transistor at thin stage is illustrated in FIG. 5A.

Figure 5B:
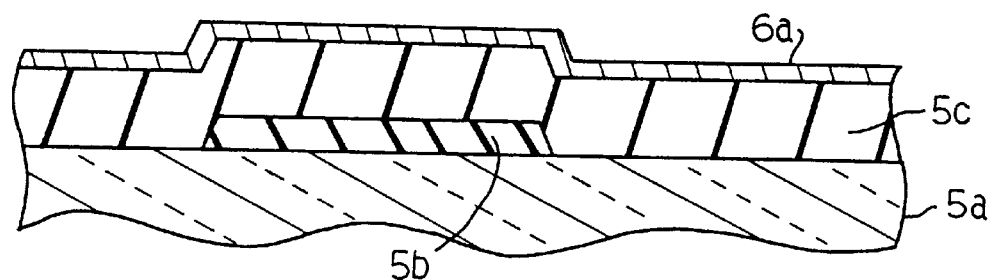
Figure 11B:
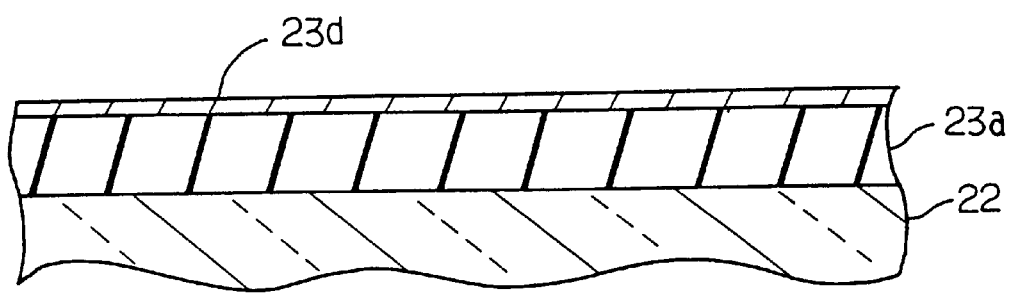

Subsequently, indium tin oxide is deposited over the entire surface of the insulating layer 23a, and forms an indium tin oxide layer 23d as shown in FIG. 11B. The resultant structure of the thin film transistor at this stage is shown in FIG. 5B.

Figure 5C:
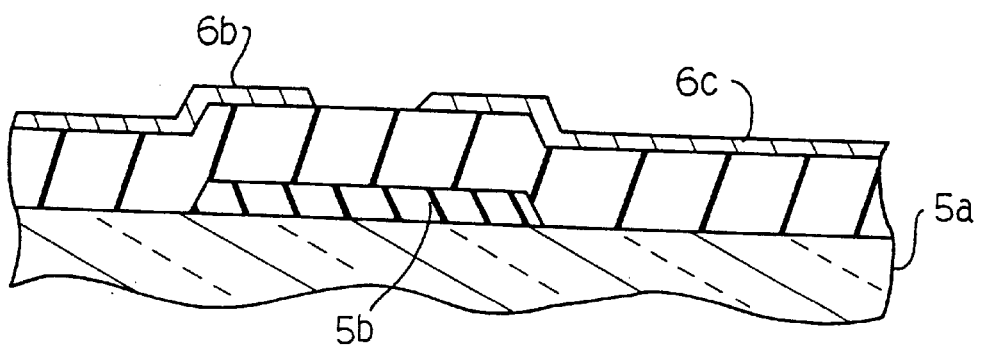
Figure 11C:
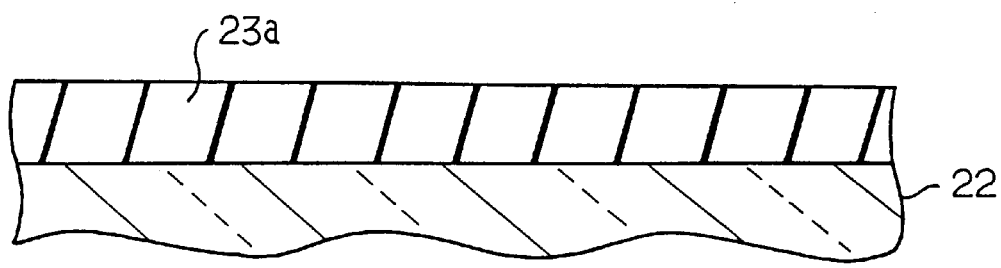

An appropriate photo-resist etching mask is formed on the indium tin oxide layer 23d by using lithographic techniques, and the indium tin oxide layer 23d is patterned into a source electrode and a drain electrode of the thin film transistor (see FIG. 5C). The indium tin oxide layer 23d is removed from the area assigned to the gate terminal, and the insulating layer is exposed again as shown in FIG. 11C. The photo-resist etching mask is stripped off.

Figure 5D:
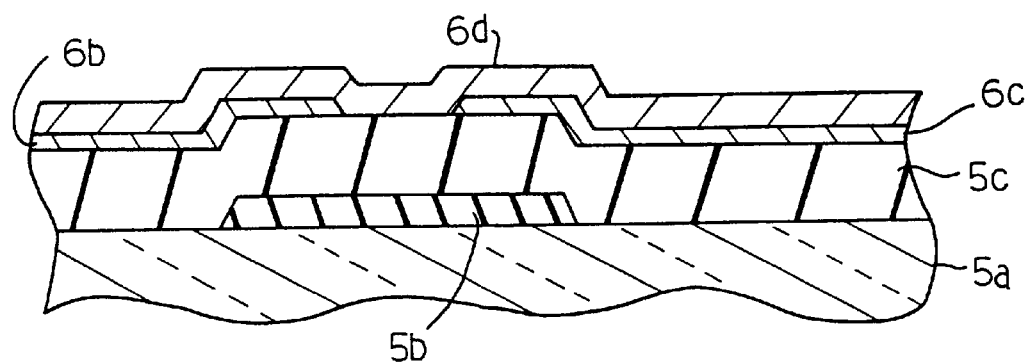
Figure 5E:
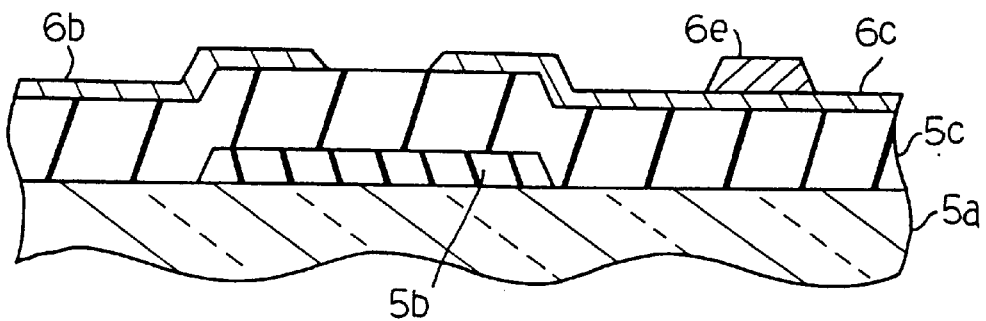
Figure 11D:
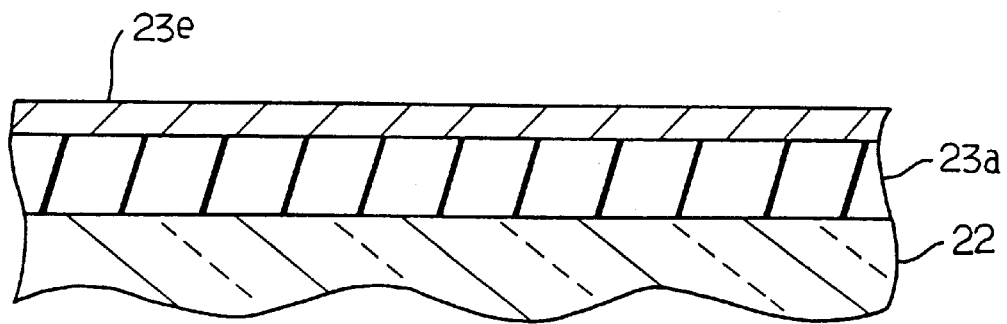
Figure 11E:
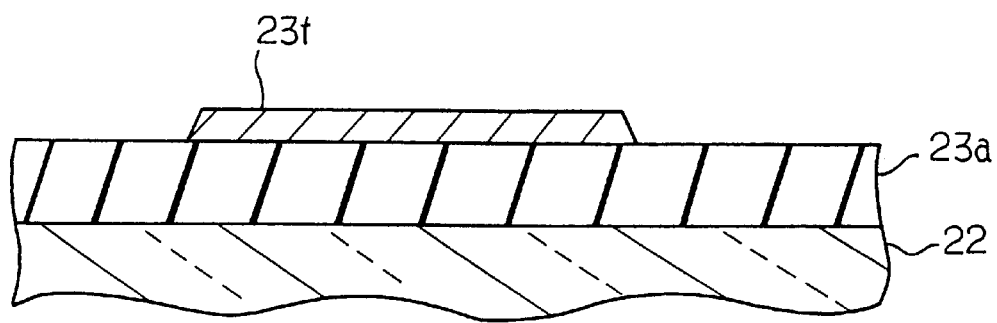

Subsequently, silicidable material such as, for example, Ti, Cr, Ni, Mo, Ta or W is deposited to 150 nanometers thick over the entire surface of the insulating layer 23a by using a sputtering at 150 degrees to 230 degrees in centigrade, and forms a silicidable layer 23e as shown in FIG. 11D. The resultant structure of the thin film transistor at this stage is illustrated in FIG. 5D.

A photo-resist etching mask (not shown) is patterned on the silicidable layer 23e. Using the photo-resist etching mask, the silicidable layer 23e is selectively etched away so as to form the image signal line 6e (see FIG. 5E) and a silicidable strip 23f (see figure 11E). The photo-resist etching mask is stripped off.

Subsequently, amorphous silicon is deposited to 60 nanometers thick over the entire surface of the resultant structure by using a plasma-assisted chemical vapor deposition at 280 degrees to 330 degrees in centigrade, and the silicidable strip 23f and the source and drain electrodes 6b/6c are covered with an amorphous silicon layer 23g. The silicidable material reacts with the amorphous silicon during the deposition, and a silicide portion 23h takes place as shown in FIG. 11F.

Silicon nitride is deposited to 400 nanometers thick over the amorphous silicon layer 23g partially converted to the silicide portion 23h by using a plasma-assisted chemical vapor deposition at 300 degrees in centigrade, and forms an insulating layer 23i. Silicon oxide may be deposited by using a chemical vapor deposition or a sputtering.

Figure 5F:
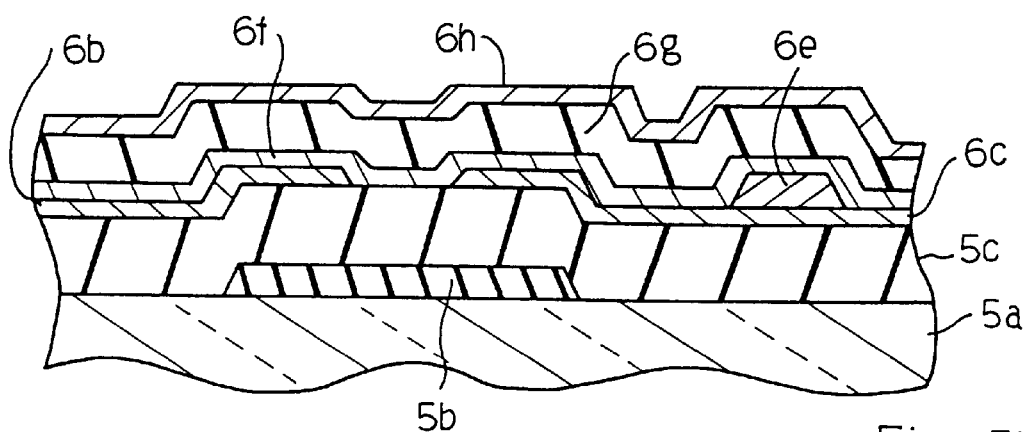
Figure 11F:
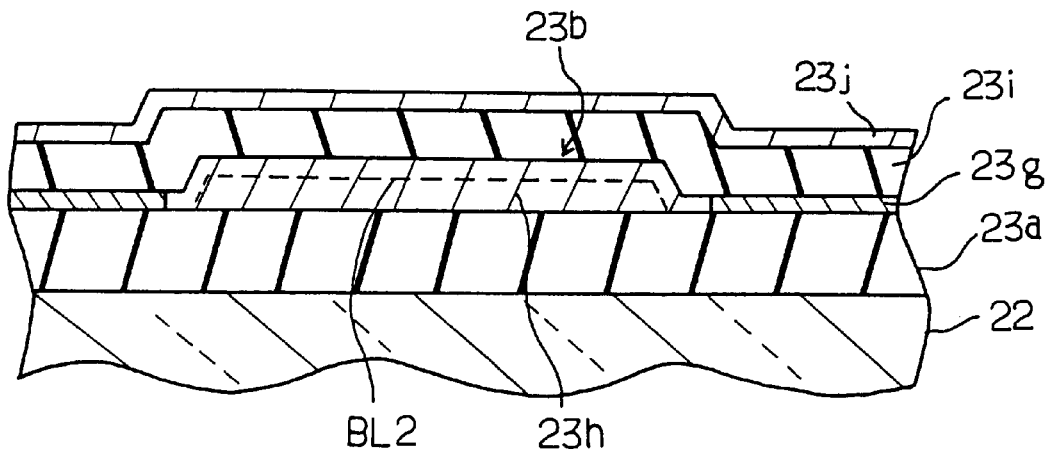

Subsequently, Cr or Al is deposited over the insulating layer 23i by using a sputtering, and form a metal layer 23j on the insulating layer 23i as shown in FIG. 11F. The resultant structure of the thin film transistor at this stage is illustrated in FIG. 5F.

Figure 5G:
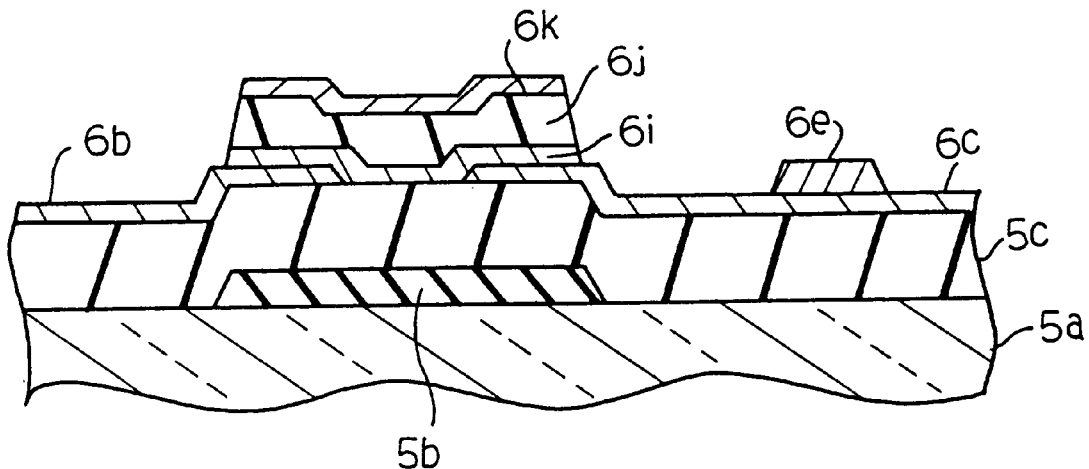
Figure 6:
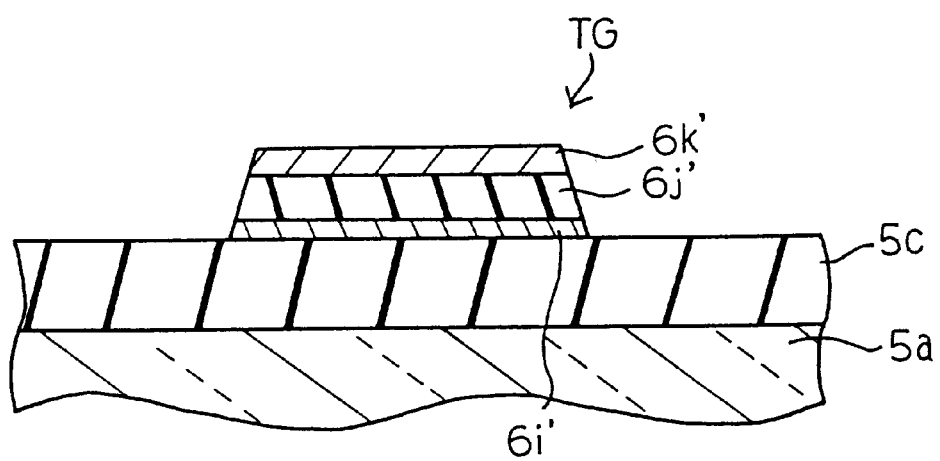
FIG. 6 is a cross sectional view showing the structure of the gate terminal formed through the prior art process.
Figure 11G:
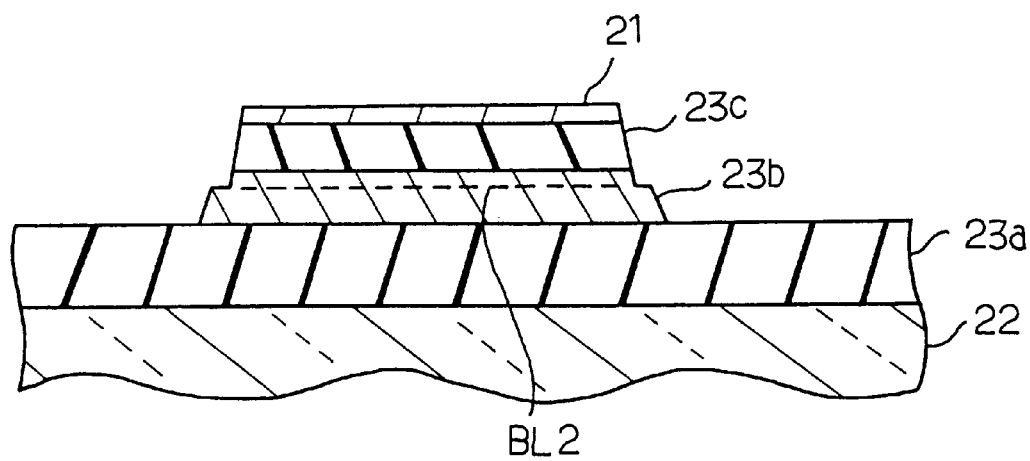

A photo-resist etching mask (not shown) is patterned on the metal layer 23j by using the lithographic techniques, and the metal layer 23j, the insulating layer 23i and the silicide portion 23h are selectively etched away so as to form the gate terminal 21, the insulating layer 23c and the silicide layer 23b as shown in FIG. 11g. Using the same photo-resist etching mask, the gate electrode 6k, the gate insulating layer 6j and the amorphous silicon layer 6i are concurrently patterned from the metal layer 23j, the insulating layer 23i and the amorphous silicon layer 23g as shown in FIG. 5G. The photo-resist etching mask may be stripped off after the patterning of the gate terminal 21 and the gate electrode 6k.

A process of fabricating the structure shown in FIG. 7 is only different from the process described hereinbefore in that the step of depositing the silicon oxide does not contain in the process.

As will be appreciated from the foregoing description, the deposition of silicidable material and the patterning step are shared between the silicidable strip 23f and the image signal line 6e, and the manufacturer does not complicate the fabrication process. The silicide layer 23b enhances the adhesion, and the peeling hardly takes place. Thus, the structure according to the present invention prevents the insulating layer 23c from peeling without sacrifice of the simple process sequence.

Although particular embodiments of the present invention have been shown and described, it will be obvious to those skilled in the art that various changes and modifications may be made without departing from the spirit and scope of the present invention.

What is claimed is:

1. A structure fabricated on a substrate structure, comprising:
   a thin film transistor including
      source and drain electrodes formed on said substrate structure and spaced apart form each other,
      a semiconductor layer extending on said substrate structure between said source and drain electrodes and held in contact with said source and drain electrodes,
      a gate insulating layer formed on said semiconductor layer, and
      a gate electrode formed on said gate insulating layer;
   a multi-layered structure including
      a silicide layer contiguous to said semiconductor layer and formed on said substrate structure, and
      a first insulating layer continued from said gate insulating layer and covering at least said silicide layer; and
   a gate terminal continued from said gate electrode and formed on said first insulating layer.

2. The structure as set forth in claim 1, in which said substrate structure includes an insulating substrate.

3. The structure as set forth in claim 2, in which said insulating substrate is formed of transparent glass.

4. The structure as set forth in claim 3, in which said thin film transistor further includes a photo-shield layer formed on said insulating substrate of said transparent glass and located under said semiconductor layer.

5. The structure as set forth in claim 3, in which said substrate structure further includes a second insulating layer formed on a major surface of said insulating substrate.

6. The structure as set forth in claim 5, in which said thin film transistor further includes a photo-shield layer between said insulating substrate of said transparent glass and said second insulating layer and located under said semiconductor layer.

7. The structure as set forth in claim 1, in which said semiconductor layer is formed of silicon, and said silicide layer contains said silicon.

8. The structure as set forth in claim 7, in which said silicide layer further contains at least one element selected from the group consisting of Ti, Cr, Ni, Mo, Ta and W.

9. The structure as set forth in claim 1, in which said thin film transistor is connected between a pixel electrode and an image signal line, and liquid crystal fills a gap between said pixel electrode and a counter electrode formed on another substrate structure.

10. The structure as set forth in claim 9, wherein said photo-shield layer is formed from a metal layer used for said second metal layer.

11. The structure as set forth in claim 1, wherein said multi-layered structure includes a conductive layer formed on said first insulating layer, and wherein said gate terminal is continued from said gate electrode to form said conductive layer.

12. The structure as set forth in claim 1, wherein said gate terminal sends gate control signals through said multi-layered structure for switching said thin-film transistor.

13. The structure as set forth in claim 12, wherein said thin-film transistor switches at least one pixel electrode included within a liquid crystal display.

14. The structure as set forth in claim 1, wherein said silicide layer adheres said first insulating layer to said substrate structure so as to prevent said first insulating layer from separating from said substrate s structure when said multi-layered structure is stressed.

15. A structure fabricated on a substrate structure, comprising;
 a thin film transistor including
  source and drain electrodes formed on said substrate structure and spaced apart from each other,
  a semiconductor layer extending on said substrate structure between said source and drain electrodes and held in contact with said source and drain electrodes,
  a gate insulating layer formed on said semiconductor layer, and a gate electrode formed on said gate insulating layer;
 a multi-layered terminal structure including
  a metal layer formed on said substrate structure,
  a second semiconductor layer formed on said metal layer,
  a silicide layer being sandwiched between said metal layer and said semiconductor layer,
  a first insulating layer continued from said gate insulating layer and covering at least said silicide layer,
 a gate terminal formed on said first insulating layer;and
 photo-shield layer formed from a metal layer partially used for silicidation of said silicide layer.

* * * * *